(12) United States Patent  
Izumi

(10) Patent No.: US 7,256,764 B2
(45) Date of Patent: Aug. 14, 2007

(54) IMAGE INPUT/OUTPUT DEVICE AND IMAGE INFORMATION READING METHOD THEREFOR

(75) Inventor: Yoshihiro Izumi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 579 days.

(21) Appl. No.: 10/679,372

(22) Filed: Oct. 7, 2003

(65) Prior Publication Data

US 2004/0075637 A1 Apr. 22, 2004

(30) Foreign Application Priority Data

Oct. 17, 2002 (JP) ............... 2002-302624

(51) Int. Cl.
*G09G 3/36* (2006.01)
(52) U.S. Cl. .................. 345/104; 345/76; 345/207; 250/208.1
(58) Field of Classification Search ............... 345/104, 345/207, 102, 76; 382/113, 114, 312; 250/208.1
See application file for complete search history.

(56) References Cited

U.S. PATENT DOCUMENTS

| 5,313,055 | A | * | 5/1994 | Shiratsuki et al. ....... 250/208.1 |
| 5,748,228 | A | * | 5/1998 | Kobayashi et al. ........... 348/63 |
| 5,812,109 | A | * | 9/1998 | Kaifu et al. ................ 345/104 |
| 5,966,112 | A | * | 10/1999 | Katagiri et al. ............. 345/104 |
| 6,295,390 | B1 | * | 9/2001 | Kobayashi et al. |

FOREIGN PATENT DOCUMENTS

| JP | 5-100645 | 4/1993 |
| JP | 6-175590 | 6/1994 |
| JP | 07322012 | 12/1995 |
| JP | 10-90655 | 4/1998 |

\* cited by examiner

*Primary Examiner*—Regina Liang
(74) *Attorney, Agent, or Firm*—Nixon & Vanderhye P.C.

(57) ABSTRACT

An image input/output device 100 includes an image information detection section 130 for detecting image information of an image information object 200 by receiving reflected light L from the image information object 200, and a self-luminous image display section 120 for displaying an image based on the image information detected by the image information detection section 130. The image information detection section 130 and the self-luminous image display section 120 are attached together in a back-to-back arrangement. The self-luminous image display section 120 functions as an image-information-detecting light source for irradiating the image information object 200 with light L through the image information detection section 130.

14 Claims, 6 Drawing Sheets

IMAGE INPUT/OUTPUT DEVICE AND IMAGE INFORMATION READING METHOD THEREFOR

BACKGROUND OF THE INVENTION

1. Field of the Invention

The present invention relates to an image input/output device in which an image information detection section for receiving reflected light from an image information object to detect the image information of the object, and a self-luminous image display section for displaying an image based on the image information detected by the image information detection section are attached together in a back-to-back arrangement, and an image information reading method therefor.

2. Description of the Prior Art

Image input/output devices in which a flat image sensor and a flat display are attached together in a back-to-back arrangement have been developed in the art.

For example, JP 5-100645A discloses a device for reading/processing/displaying external information. The device includes a display device such as a flat panel display and a scanner for reading external information integrally attached to the back side of the display device, with the backlight (light source) of the display device being used also as the light source of the scanner. An information processing device is integrated with the scanner and the display device so that scanned information from the scanner is displayed on the display device. It is stated that since the scanner is provided so as to form a part of the whole device, it is possible to display information from the scanner with a small and light-weight device.

JP 6-175590A discloses a card-shaped display device including a two-dimensional contact image sensor to be placed closely on a scanned object for reading the image of the object in the image-reading area, a liquid crystal display provided above the two-dimensional image sensor, and a double-sided light source provided between the two-dimensional image sensor and the liquid crystal display for illuminating the surface of the scanned object through the two-dimensional image sensor and also for displaying the image of the object on the liquid crystal display. It is stated that using the card-shaped device in which an image-reading section and a display section are integrated together, it is possible to read the image of the scanned object with the two-dimensional image sensor placed closely on the scanned object and to immediately display the obtained image on the liquid crystal display.

JP 7-322012A discloses an image input/output device including a two-dimensional contact image sensor and a liquid crystal display for displaying, on an enlarged scale, whole or part of image information obtained by the image sensor. The image sensor and the liquid crystal display are arranged so that the image-reading surface of the image sensor and the display surface of the liquid crystal display are the front and back surfaces, respectively, of the image input/output device, with the display surface being located directly above the image-reading area. The publication states as follows. Since the display surface is located directly above the image-reading area, the place where an image is being obtained corresponds to the place where it is being displayed, thereby eliminating the possibility of mis-reading as the user can obtain the image while viewing it on the display. Moreover, the device can be provided with an image enlarging function and a translation function, thus realizing a compact and easy-to-use image input/output device. Furthermore, in the image input/output device disclosed in JP 7-322012A, a flat light source (including a light source, a reflective member and a light guide plate) is provided between the front-side liquid crystal display and the back-side image sensor, and the flat light source is used as the backlight for the liquid crystal display and as the light source for the image sensor (a light source for illuminating the scanned object).

When such an image input/output device is used as a portable information-collecting tool, it is necessary to reduce the thickness of the device as much as possible in order to improve the portability thereof.

However, as illustrated in FIG. 9, it is difficult to reduce the thickness of a conventional image input/output device 300 because of the structure thereof in which three components, i.e., a display 310, a light source 320 and an image sensor (scanner) 330, are layered on one another.

SUMMARY OF THE INVENTION

It is an object of the present invention to provide a novel image input/output device whose thickness can be reduced.

In order to achieve the object, the present invention provides an image input/output device using a self-luminous image display section, which itself is used as an image-information-detecting light source.

Specifically, an image input/output device of the present invention is an image input/output device in which an image information detection section for receiving reflected light from an image information object to detect the image information of the object, and a self-luminous image display section for displaying an image based on the image information detected by the image information detection section are attached together in a back-to-back arrangement, wherein the self-luminous image display section functions as an image-information-detecting light source for irradiating an image information object with light through the image information detection section.

With such a structure, the self-luminous image display section itself functions as the image-information-detecting light source. Therefore, it is no longer necessary to provide the image-information-detecting light source as a separate component, as in the prior art, thereby reducing the total thickness of the device accordingly.

The self-luminous image display section may be, for example, an organic electroluminescence (EL) display, an inorganic EL display, a plasma-addressed display, or the like. An organic EL display or an inorganic EL display is suitable for reducing the thickness of the device.

In the image input/output device of the present invention, the image display section, which functions as the image-information-detecting light source, may emit light both toward an image display side and toward an image information detection side.

With such a structure, the image display section emits light both toward the image display side and toward the image information detection side. Therefore, the device can be realized with a simple structure where the direction in which the self-luminous image display section emits light does not need to be restricted.

In the image input/output device of the present invention, the image display section, which functions as the image-information-detecting light source, may emit light only toward an image display side; and the image input/output device may further include light reflecting means for reflecting light emitted toward the image display side from the image display section, which functions as the image-information-detecting light source, toward an image information detection side.

With such a structure, the direction in which the image display section emits light is restricted so that light is emitted only toward the image display side, whereby while the image is displayed, 100% of light from the image display section is used for displaying the image, thereby achieving a high display quality. Moreover, the image input/output device includes the light reflecting means for reflecting light from the image display section toward the image information detection side, whereby when detecting image information, light can be reflected by the light reflecting means toward the image information object. The light reflecting means may be, for example, a mirror provided on one side, closer to the image display section, of a cover member that can be opened and closed so that the cover member can cover a display surface of the image display section.

In the image input/output device of the present invention, the image information detection section may include a detection section substrate and a plurality of photodetector elements provided on the detection section substrate; and the detection section substrate may be placed so that one surface thereof on which the plurality of photodetector elements are provided is facing inwardly.

When the detection section substrate is placed so that the surface thereof on which the photodetector elements are provided is facing outwardly, it is necessary to provide a protection layer for covering the photodetector elements so as to prevent the photodetector elements from contacting moisture or oxygen. With such a structure as described above, however, the detection section substrate is placed so that the surface thereof on which the photodetector elements are provided is facing inwardly, whereby the detection section substrate prevents moisture or oxygen from contacting the photodetector elements. Thus, the photodetector elements can be sealed with a simple structure.

In the image input/output device of the present invention as described above, the image display section may include a display section substrate, and a transparent filler layer may be provided between the detection section substrate and the display section substrate. Then, it is possible to more reliably prevent moisture or oxygen from contacting the photodetectror elements.

In the image input/output device of the present invention, the image display section may include a display section substrate and a plurality of display elements provided on the display section substrate; and the display section substrate may be placed so that one surface thereof on which the plurality of display elements are provided is facing inwardly.

With such a structure, the display section substrate is placed so that the surface thereof on which the display elements are provided is facing inwardly, whereby the display section substrate prevents moisture or oxygen from contacting the display elements, as in the case described above where moisture or oxygen is prevented from contacting the photodetector elements. Thus, the display elements can be sealed with a simple structure.

In the image input/output device of the present invention as described above, the image information detection section may include a detection section substrate, and a transparent filler layer may be provided between the detection section substrate and the display section substrate. Then, it is possible to more reliably prevent moisture or oxygen from contacting the display elements.

In the image input/output device of the present invention, the image information detection section may include a detection section substrate and a plurality of photodetector elements provided on the detection section substrate, and the image display section may include a display section substrate and a plurality of display elements provided on a display section substrate; and the detection section substrate may be placed so that one surface thereof on which the plurality of photodetector elements are provided is facing inwardly, and the display section substrate may be placed so that one surface thereof on which the plurality of display elements are provided is facing inwardly.

With such a structure, the detection section substrate and the display section substrate are placed so that their surfaces on which the respective elements are provided are facing inwardly, whereby these substrates prevent moisture or oxygen from contacting the photodetector elements and the display elements. Thus, the photodetector elements and the display elements can be both sealed with a simple structure.

In the image input/output device of the present invention as described above, a transparent filler layer may be provided between the detection section substrate and the display section substrate. Then, it is possible to more reliably prevent moisture or oxygen from contacting the display elements and the photodetector elements.

In the image input/output device of the present invention, when detecting image information, portions of the image display section, which functions as the image-information-detecting light source, may emit light successively, and a portion of the image information detection section, which corresponds to a portion of the image display section that has emitted light, may detect and store image information.

With such a structure, when detecting image information, portions of the image display section, which functions as the image-information-detecting light source, emit light successively, whereby the load on the driving circuit system of the image display section is smaller as compared with a case where the image display section emits light from the entire surface thereof at the same time.

In the image input/output device of the present invention as described above, an image information reading operation may be initiated for those portions of the image information detection section that have already detected and stored image information, before light emission from all portions of the image display section is completed.

With such a structure, the image information reading operation is initiated for those portions of the image information detection section that have already detected and stored image information, before light emission from all portions of the image display section is completed. Therefore, while a plurality of portions of the image information detection section separately detect and store image information, the image information reading operation can be completed at an early point in time.

Specifically, this can be achieved as follows, for example. The image display section emits light in a line sequential manner for detecting image information. Image information is stored along a portion of the image information detection section corresponding to the portion of the image display section that is emitting light in a line sequential manner. Then, image information is successively read from portions of the image information detection section that have stored the image information.

Therefore, in the image input/output device of the present invention, the image display section may successively emit light in a line sequential manner. An image information reading operation may be initiated for those portions of the image information detection section that have already detected and stored image information, before light emission from all portions of the image display section in a line sequential manner is completed. Image information may be read from the image information detection section in a sequential line-addressing corresponding to that of the image display section.

An image information reading method of the present invention is an image information reading method for reading image information from image information detection means for detecting and storing image information of an image information object by receiving light that has been reflected from the image information object, wherein:

a plurality of portions of the image information object are successively irradiated with light, and image information of a portion of the image information object that is irradiated with light is detected and stored by the image information detection means; and an operation of reading image information from the image information detection means is initiated for portions of image information object where image information has already been detected and stored by the image information detection means, before light irradiation of all portions of the image information object is completed.

In the image information reading method of the present invention, light irradiation of the image information object may be performed in a line sequential manner. An operation of reading image information from the image information detection means may be performed in a sequential line-addressing corresponding to that of the light irradiation of the image information object.

BRIEF DESCRIPTION OF THE DRAWINGS

The above and other objects, advantages and features of the invention will become apparent from the following description when taken in conjunction with the accompanying drawings, in which.

DETAILED DESCRIPTION OF THE PREFERRED EMBODIMENTS

The preferred embodiments of the present invention will now be described with reference to the accompanying drawings.

Embodiment 1

Figure 1:
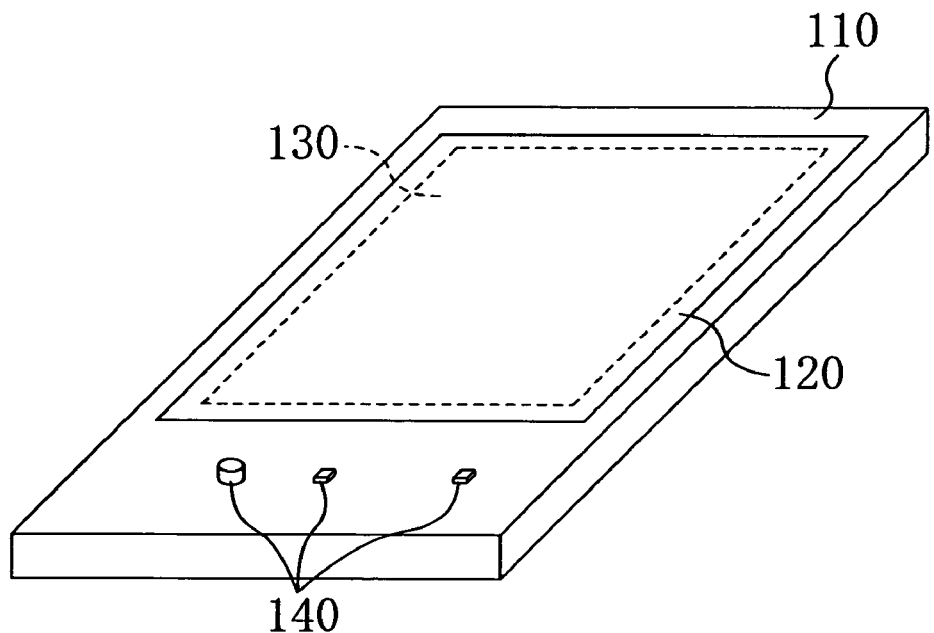
FIG. 1 is a perspective view illustrating an image input/output device according to Embodiment 1 of the present invention.
Figure 2:
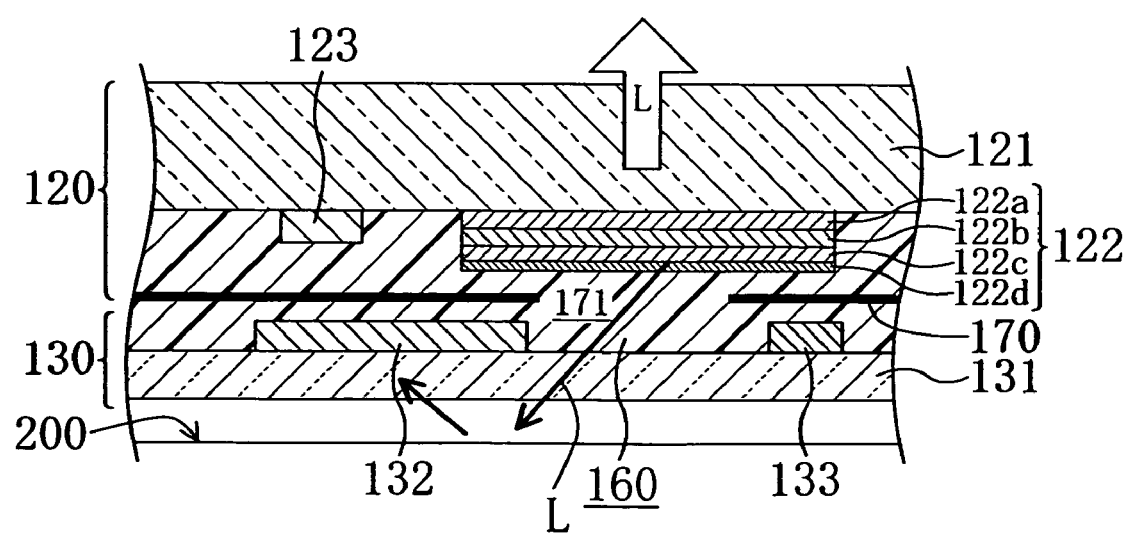
FIG. 2 is a cross-sectional view illustrating a part of the image input/output device according to Embodiment 1 of the present invention.

FIG. 1 illustrates an image input/output device 100 according to Embodiment 1 of the present invention. FIG. 2 is a cross-sectional view illustrating a part of the image input/output device 100.

The image input/output device 100 includes a main body 110 formed in a rectangular panel shape, a rectangular organic EL display (the image display section) 120 provided on the front side, and an image sensor (the image information detection section or the image information detection means) 130 having a rectangular shape corresponding to that of the organic EL display 120 and provided on the back side. In other words, the image input/output device 100 includes the organic EL display 120 and the image sensor 130 attached together in a back-to-back arrangement. Moreover, a plurality of operation switches 140 are provided outside the area of the organic EL display 120 on the front-side surface.

The organic EL display 120 includes a transparent organic EL display substrate (the display section substrate) 121 made of a glass or a resin, and a plurality of organic EL elements (display elements) 122 arranged in a matrix pattern on the organic EL display substrate 121 and each forming one pixel, with the surface of the organic EL display substrate 121 on which the organic EL elements 122 are provided facing inwardly, i.e., facing the image sensor 130. On the inner surface of the organic EL display substrate 121, a plurality of scanning lines are provided so as to extend in parallel to one another, and a plurality of signal lines are provided so as to extend in a layer that is different from the layer of the scanning lines and in parallel to one another in a direction perpendicular to the scanning lines. The organic EL element 122 is provided for each intersection between the scanning line and the signal line. Each organic EL element 122 is connected to the corresponding scanning line and the corresponding signal line via a switching element 123 such as a thin film transistor (TFT) made of polysilicon.

Each organic EL element 122 includes a transparent electrode 122a, a hole injection/transport layer 122b, an organic EL layer 122c and a metal electrode 122d, which are deposited in this order starting from the substrate side. The transparent electrode 122a is an anode made of ITO (indium tin oxide), or the like, for injecting holes into the hole injection/transport layer 122b. The hole injection/transport layer 122b is made of a phthalocyanine compound, an aromatic amine compound, or the like, and carries the holes injected from the transparent electrode 122a to the organic EL layer 122c. The metal electrode 122d is a cathode made of aluminum, magnesium, or the like, for injecting electrons into the organic EL layer 122c. The organic EL layer 122c is a thin film having a thickness of about 1 µm and made of an organic phosphor such as an aromatic ring compound or a heterocyclic compound. The organic EL layer 122c emits light upon recombination of an electron from the metal electrode 122d and a hole from the transparent electrode 122a and the hole injection/transport layer 122b. The organic EL layer 122c emits light in every direction. Moreover, the metal electrode 122d is formed as a half mirror, or an opening is provided in the metal electrode 122d. Therefore, light L from the organic EL layer 122c leaks toward the image information detection surface. Thus, the organic EL display 120 emits light L both toward the image display surface and toward the image information detection surface.

The image sensor 130 includes a transparent image sensor substrate (the detection section substrate) 131 made of a glass or a resin, and a plurality of photodetector elements 132 arranged in a matrix pattern on the image sensor substrate 131, with the surface of the image sensor substrate 131 on which the photodetector elements 132 are provided facing inwardly, i.e., facing the organic EL display 120. On the inner surface of the image sensor substrate 131, a plurality of scanning lines are provided so as to extend in parallel to one another, and a plurality of signal lines are provided so as to extend in a layer that is different from the layer of the scanning lines and in parallel to one another in a direction perpendicular to the scanning lines. The photodetector element 132 is provided for each intersection between the scanning line and the signal line. Each photodetector element 132 is, for example, a photodiode, a phototransistor, a photoconductor, or the like, and is connected to the corresponding scanning line and the corresponding signal line via a switching element 133 such as a thin film transistor (TFT) made of amorphous silicon or polysilicon. The scanning lines, the signal lines and the photodetector elements 132 of the image sensor 130 are in one-to-one correspondence with the scanning lines, the signal lines and the organic EL elements 122, respectively, of the organic EL display 120.

Figure 3:
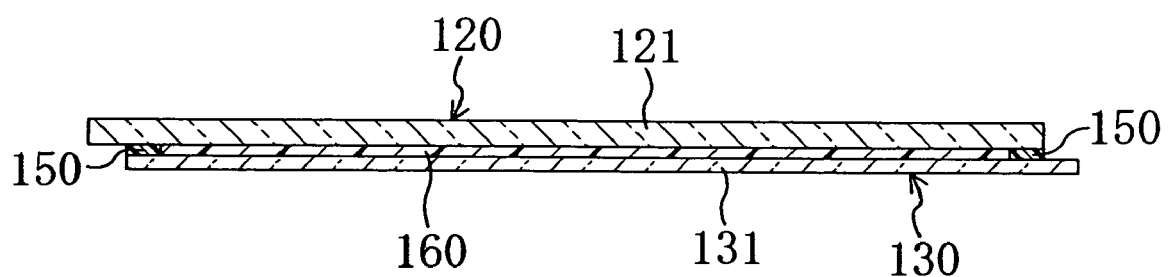
FIG. 3 is a side view illustrating how an organic EL display and an image sensor are attached to each other in the image input/output device according to Embodiment 1 of the present invention.

The organic EL display substrate 121 of the organic EL display 120 and the image sensor substrate 131 of the image sensor 130 are provided so as to oppose each other with their element-side surfaces (the term "element-side surface" as used herein refers to the surface on which the organic EL elements or the photodetector elements are provided) facing inwardly. As illustrated in FIG. 3, the substrates 121 and 131 are attached together with a sealant 150 along the periphery thereof, and a resin layer (the transparent filler) 160 is formed by filling up the space partitioned by the substrates 121 and 131 and the sealant 150 with an adhesive resin, thereby preventing the organic EL elements 122 and the photodetector elements 132 from contacting the air or moisture. Moreover, a light blocking film 170 made of a metal foil sheet, a carbon sheet, or the like, is provided in the middle of the resin layer 160 so as to partition the organic EL display substrate 121 and the image sensor substrate 131 from each other, thereby suppressing crosstalk between the substrates 121 and 131 while blocking ambient light. The light blocking film 170 includes an opening 171 for each organic EL element 122 so that a portion of the organic EL element 122 is exposed therethrough while the corresponding photodetector element 132 is blocked. Therefore, light L from the organic EL element 122 is emitted toward the image information detection surface through the opening 171 to be incident upon a scanned object (the image information object) 200 through the image sensor substrate 131 so that the reflected light L is incident upon the photodetector element 132. Thus, in the image input/output device 100, the organic EL display 120 functions as an image-information-detecting light source for irradiating the scanned object 200 with light L through the image sensor 130.

In addition to the organic EL display 120 and the image sensor 130, the main body 110 further includes a driver, a driving circuit, a memory device, a CPU, a power supply section, etc., which are provided around the organic EL display 120 and the image sensor 130.

Next, the image input/output operation by the image input/output device 100 will be described.

Figure 4:
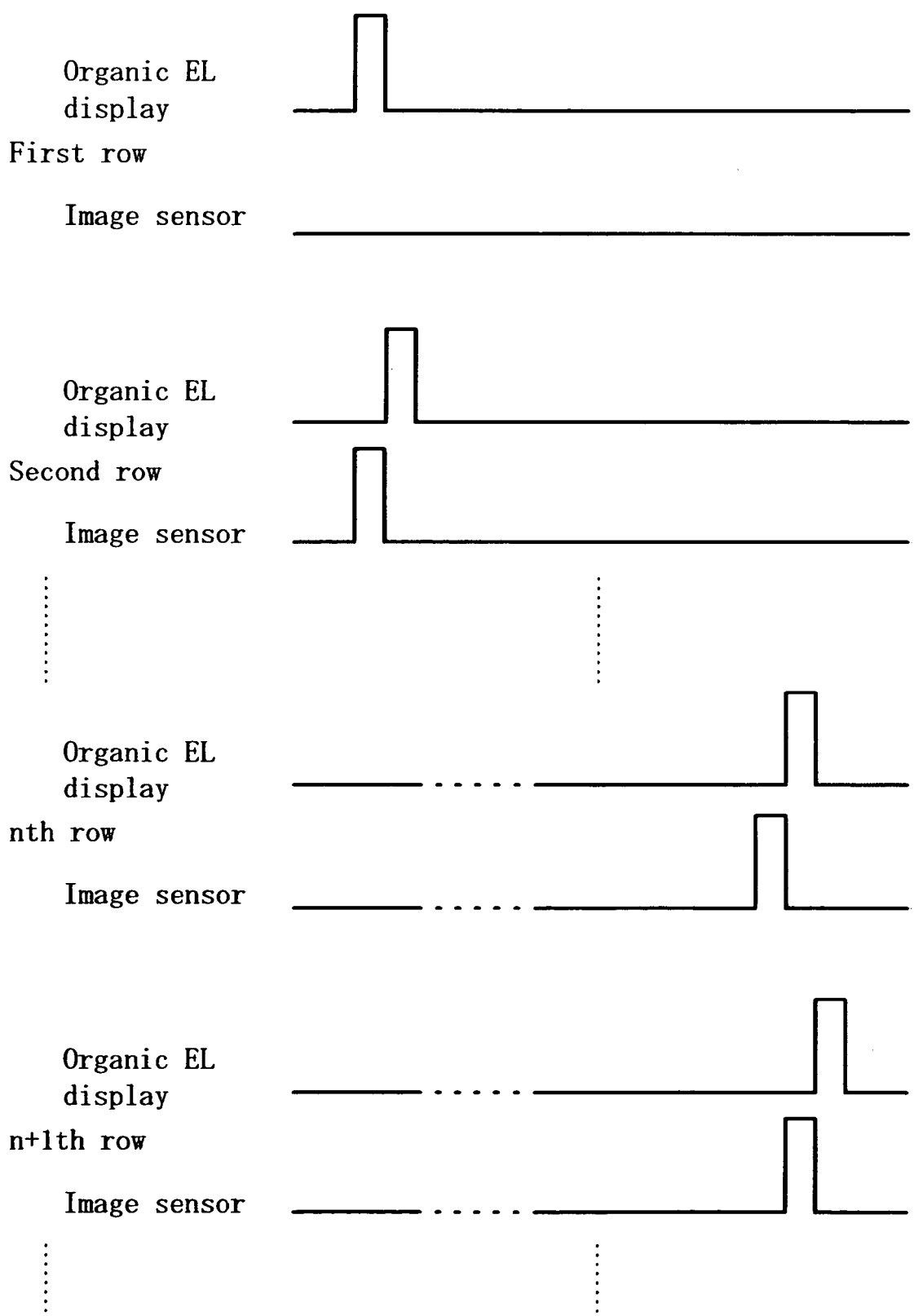
FIG. 4 illustrates scanning voltages for the organic EL display and the image sensor of the image input/output device according to Embodiment 1 of the present invention.

The image input device is placed over the scanned object 200 with the image sensor 130 facing down, and the image input/output switch is turned ON. Then, the organic EL display 120 emits light in a line sequential manner. Specifically, as a scanning voltage is supplied to one scanning line of the organic EL display 120, TFTs of the row corresponding to the scanning line are all turned ON, thereby selecting the organic EL elements 122 of the row. As a predetermined signal voltage is supplied from a signal line to a selected organic EL element 122, the organic EL element 122 emits light, whereby the organic EL display 120 emits light in a partial and linear pattern. Thus, as a scanning voltage is supplied successively to the scanning lines of the first, second, ..., $n^{th}$, $n+1^{th}$, ..., rows of the organic EL display 120, as illustrated in FIG. 4, a linear pattern of light emission moves in the column direction, thereby emitting light in a line sequential manner. Thus, when detecting image information, portions of the organic EL display 120, which functions as the image-information-detecting light source, emit light successively. In this operation, light L from the organic EL display 120 is emitted not only toward the image display surface, but light L from each organic EL element 122 is emitted also toward the image information detection surface through the corresponding opening 171 in the light blocking film 170. Light L emitted toward the image information detection surface is reflected by the scanned object 200, and the reflected light L is then incident upon the photodetector element 132 corresponding to the row from which the light L is emitted. Each photodetector element 132 stores, as an electrical signal, image information according to the brightness of the reflected light that it receives.

The image information stored in the photodetector elements 132 is read by the image sensor 130 in a line sequential manner. Specifically, as a scanning voltage is supplied to one scanning line of the image sensor 130, TFTs of the row corresponding to the scanning line are all turned ON, thereby selecting the photodetector elements 132 of the row. Then, stored image information is read from the selected photodetector elements 132 via signal lines. Thus, image information is read in a line sequential manner by successively supplying a scanning voltage to the scanning lines of the image sensor 130 for the rows for which light has already been emitted in a line sequential manner and image information has already been stored in the photodetector elements 132. As illustrated in FIG. 4, a scanning voltage is supplied successively to the scanning lines of the first, second, ..., $n^{th}$, $n+1^{th}$, ..., rows of the organic EL display 120. Also as illustrated in FIG. 4, a scanning voltage is supplied to the scanning line of the first row of the image sensor 130 when a scanning voltage is supplied to the scanning line of the second row of the organic EL display 120, and a scanning voltage is supplied to the scanning line of the $n^{th}$ row of the image sensor 130 when a scanning voltage is supplied to the scanning line of the $n+1^{th}$ row of the organic EL display 120. Thus, a scanning voltage is supplied to a scanning line of the image sensor 130 that corresponds to the scanning line of the organic EL display 120 preceding the scanning line thereof to which a scanning voltage is being supplied, and the image information reading operation is initiated for those portions of the image sensor 130 where image information has already been detected and stored, before light emission from all portions of the organic EL display 120 is completed. In this way, it is possible to quickly start reading image information from those portions of the image sensor 130 that have stored image information using light emitted from the organic EL display 120 in a line sequential manner. Then, as the entire image information is read, the image information is subjected to image processing operations, such as sensitivity correction (gray level correction), luminance distribution correction and pixel defect correction, by a signal processing circuit based on the two-dimensional brightness distribution of the obtained image information, thereby producing corrected image information.

Then, the organic EL display 120 displays an image based on the corrected image information in a line sequential manner. Specifically, as a scanning voltage is supplied successively to the scanning lines of the first, second, ..., $n^{th}$, $n+1^{th}$, ..., rows of the organic EL display 120, TFTs of the row corresponding to the scanning line to which a scanning voltage is being supplied are all turned ON, thereby selecting the organic EL elements 122 of the row. Then, as a signal voltage based on the corrected image information is supplied to each of the selected organic EL elements 122 from a signal line, the organic EL element 122 emits light with a brightness corresponding to the signal voltage, thereby displaying an image in a line sequential manner.

In the image input/output device 100 of Embodiment 1 as described above, the self-luminous organic EL display 120 itself functions as the image-information-detecting light source. Therefore, it is no longer necessary to provide the image-information-detecting light source as a separate component, as in the prior art, thereby reducing the total thickness of the device accordingly and thus significantly improving the portability of the device. Note that the thickness of the light blocking film 170 is smaller than that of a flat light source (on the order of millimeters) by one order of magnitude or more, whereby the provision of the light blocking film 170 adds very little to the total thickness of the device.

Moreover, when a widely-used flat light source such as an edge-type light source with a light guide plate or a direct-type light source with a diffusion plate is employed as a separate component, as in the prior art, it is difficult to achieve a uniform luminance distribution across the surface of the image sensor 130, whereby it is necessary to correct substantial luminance non-uniformity, which may be as high as 20 to 30%. However, in the image input/output device 100 having a structure as described above, the organic EL display 120 itself functions as the image-information-detecting light source. Therefore, the luminance distribution across the surface of the image sensor 130 is substantially uniform (luminance non-uniformity < about 5%), whereby the signal correction operation that is necessitated by luminance non-uniformity is easy.

Moreover, when detecting image information, portions of the organic EL display 120, which functions as the image-information-detecting light source, emit light successively in a line sequential manner. Therefore, the load on the driving circuit system of the organic EL display 120 is smaller as compared with a case where the organic EL display 120 emits light from the entire surface thereof at the same time.

Moreover, the image information reading operation is initiated for those portions of the image sensor 130 where image information has already been detected and stored, before light emission from all portions of the organic EL display 120 in a line sequential manner is completed. Therefore, while a plurality of portions of the image sensor 130 separately detect and store image information, the image information reading operation can be completed at an early point in time.

When an organic EL display substrate is placed so that the surface thereof on which photodetector elements are provided is facing outwardly, it is necessary to provide a protection layer covering the photodetector elements so as to prevent the photodetector elements from deteriorating by contacting moisture or oxygen. However, in the image input/output device 100 having a structure as described above, the image sensor substrate 131 is placed so that the surface thereof on which the photodetector elements 132 are provided is facing inwardly. Therefore, the image sensor substrate 131 prevents moisture or oxygen from contacting the photodetector elements 132. Thus, the photodetector elements 132 can be sealed with such a simple structure. Moreover, as it is not necessary to separately provide a protection substrate, the total thickness of the device and the production cost of the device can be reduced. Note that in order to improve the sealing property, a glass substrate having a higher dimensional stability than a resin substrate is suitably used for the organic EL display substrate 121 and the image sensor substrate 131.

Embodiment 2

Figure 5A:
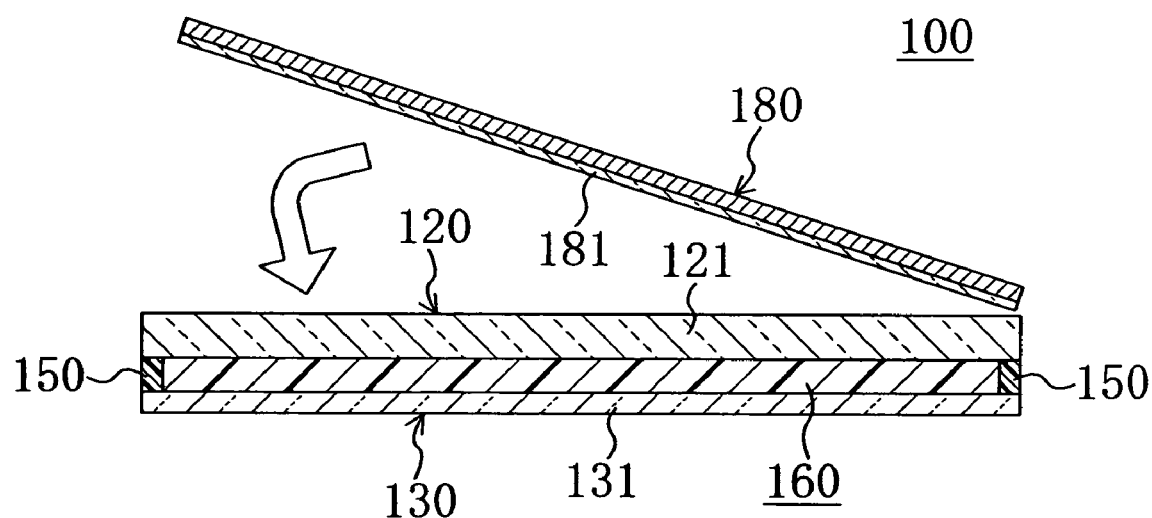
FIG. 5A and FIG. 5B are side views illustrating an image input/output device according to Embodiment 2 of the present invention.
Figure 5B:
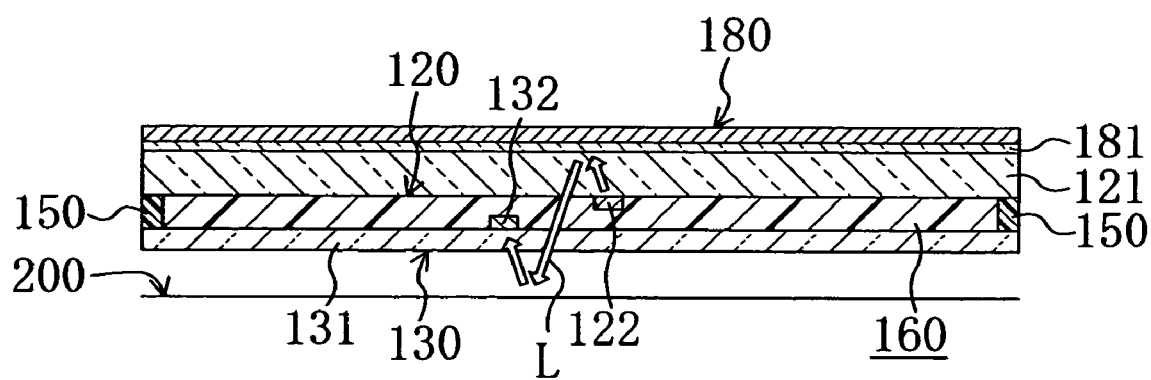

FIG. 5A and FIG. 5B illustrate the image input/output device 100 according to Embodiment 2 of the present invention. The same components as those of Embodiment 1 will be denoted by the same reference numerals.

In the image input/output device 100, the organic EL element 122 is designed so that light L from the organic EL layer 122c is reflected by the metal electrode 122d toward the image display surface. Thus, the organic EL display 120 emits light L only toward the image display surface. Moreover, the image input/output device 100 includes a cover member 180 having the same outer shape as that of the organic EL display 120. The cover member 180 is pivotally supported along one of the short sides of the organic EL display 120 so that the cover member 180 can be opened and closed. Thus, the display surface of the organic EL display 120 can be covered by the cover member 180. A mirror (the light reflecting means) 181 is provided on the rear surface of the cover member 180, i.e., the surface of the cover member 180 that is closer to the organic EL display 120, so that when the organic EL display 120 emits light with the cover member 180 being closed, light L from the organic EL display 120 is reflected by the mirror 181 toward the image information detection surface. Furthermore, the light blocking film includes openings therein that are located so as not to overlap with the organic EL elements 122, so that light L reflected by the mirror 181 is incident upon the scanned object 200 through the image sensor substrate 131, and the reflected light L from the scanned object 200 is then incident upon the photodetector element 132.

The operation of inputting an image by the image input/output device 100 is performed with the cover member 180 being closed. Specifically, light L is emitted from the organic EL display 120 toward the image display surface, reflected by the mirror 181 toward the image information detection surface to be incident upon and reflected by the scanned object 200, and the reflected light L is then incident upon the photodetector element 132 so that the photodetector element 132 stores, as an electrical signal, image information according to the brightness of the received light L. The image is output to the organic EL display 120 so that the image can be viewed by opening the cover member 180.

Other than this, the structure and the image input/output operation of the image input/output device 100 of the present embodiment are the same as those of Embodiment 1.

With the image input/output device 100 of Embodiment 2 as described above, the direction in which light is emitted from the organic EL display 120 is restricted so that light L is emitted only toward the image display surface, whereby while the image is displayed, 100% of light L from the organic EL display 120 is used for displaying the image, thereby achieving a high display quality. On the other hand, the image input/output device 100 includes the mirror 181 for reflecting light L from the organic EL display 120 toward the image information detection surface, whereby when detecting image information, light L can be reflected by the mirror 181 toward the scanned object 200.

Other than this, the functions/effects of the present embodiment are the same as those of Embodiment 1.

Embodiment 3

Figure 6:
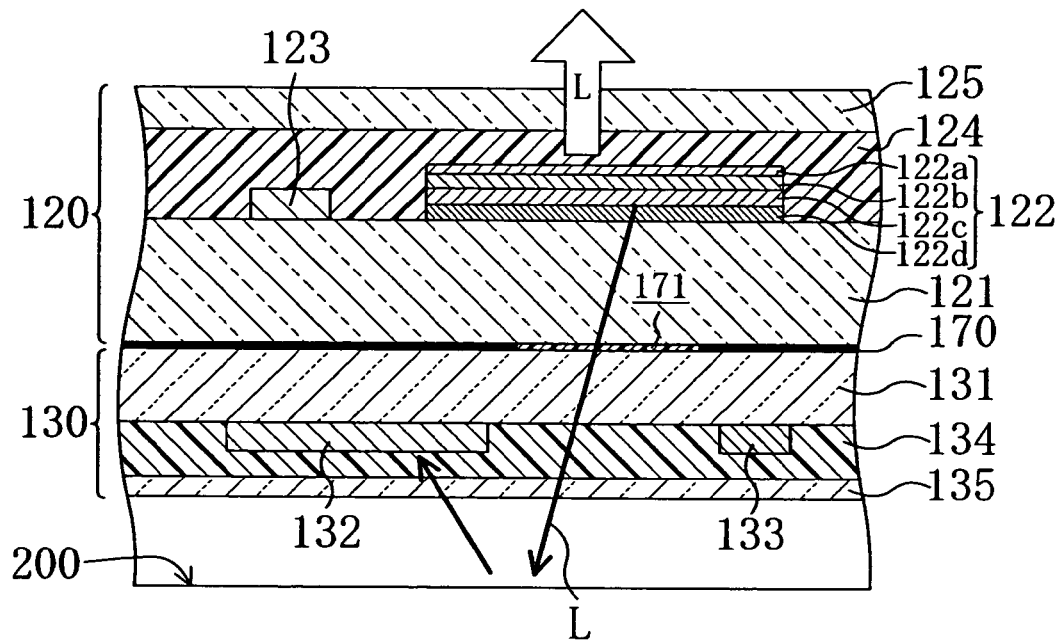
FIG. 6 is a cross-sectional view illustrating a part of an image input/output device according to Embodiment 3 of the present invention.

FIG. 6 is a cross-sectional view illustrating a part of the image input/output device 100 according to Embodiment 3 of the present invention. The same components as those of Embodiment 1 will be denoted by the same reference numerals.

In the image input/output device 100, the organic EL display substrate 121 and the image sensor substrate 131 are attached together with the light blocking film 170 therebetween with their element-side surfaces facing outwardly. Moreover, each organic EL element 122 includes the metal electrode 122*d*, the organic EL layer 122*c*, the hole injection/transport layer 122*b* and the transparent electrode 122*a*, which are deposited in this order starting from the substrate side. Furthermore, a sealing substrate 125 is provided so as to oppose the organic EL display substrate 121 via a resin layer 124 therebetween, thereby forming the organic EL display 120. Similarly, a protection substrate 135 is provided so as to oppose the image sensor substrate 131 via a resin layer 134 therebetween, thereby forming the image sensor 130.

Other than this, the structure and the image input/output operation of the image input/output device 100 of the present embodiment are the same as those of Embodiment 1.

The functions/effects of the image input/output device 100 of the present embodiment are the same as those of Embodiment 1, except for those that derive from the elimination of the need to provide the protection substrate 135 for the image sensor 130.

Embodiment 4

Figure 7:
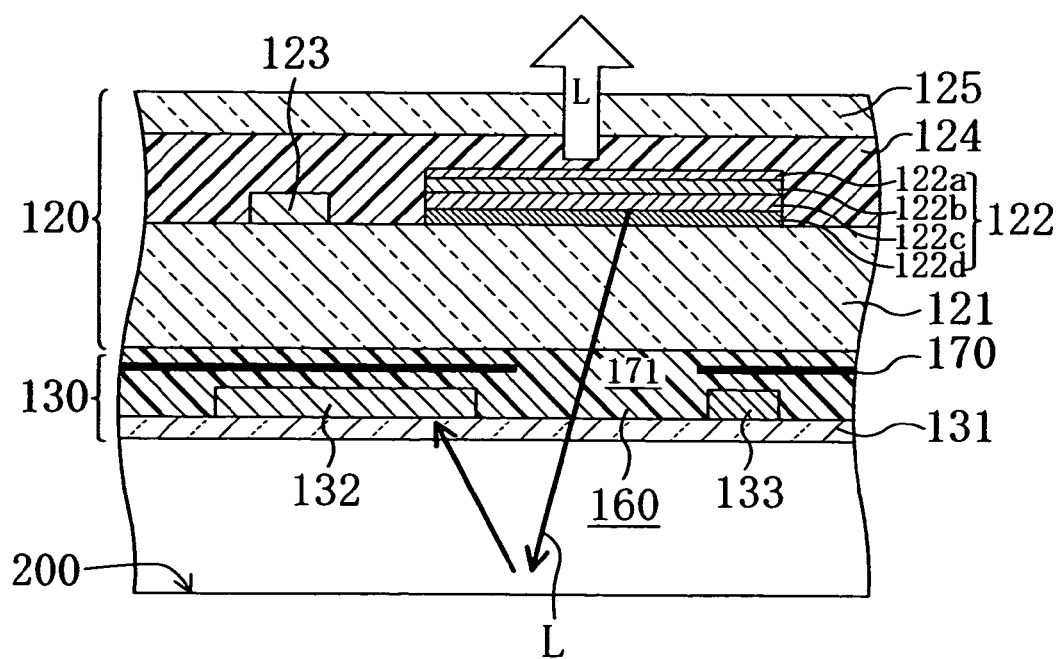
FIG. 7 is a cross-sectional view illustrating a part of an image input/output device according to Embodiment 4 of the present invention.

FIG. 7 is a cross-sectional view illustrating a part of the image input/output device 100 according to Embodiment 4 of the present invention. The same components as those of Embodiment 1 will be denoted by the same reference numerals.

In the image input/output device 100, the organic EL display substrate 121 is placed so that the element-side surface thereof is facing outwardly, while the image sensor substrate 131 is placed so that the element-side surface thereof is facing inwardly. The resin layer (the transparent filler) 160 made of an adhesive resin is formed between the organic EL display substrate 121 and the image sensor substrate 131, thereby preventing the photodetector elements 132 from contacting the air or moisture. Moreover, each organic EL element 122 includes the metal electrode 122*d*, the organic EL layer 122*c*, the hole injection/transport layer 122*b* and the transparent electrode 122*a*, which are deposited in this order starting from the substrate side.

Furthermore, the sealing substrate 125 is provided so as to oppose the organic EL display substrate 121 via the resin layer 124 therebetween, thereby forming the organic EL display 120.

Other than this, the image input/output operation and the functions/effects of the image input/output device 100 of the present embodiment are the same as those of Embodiment 1.

Embodiment 5

Figure 8:
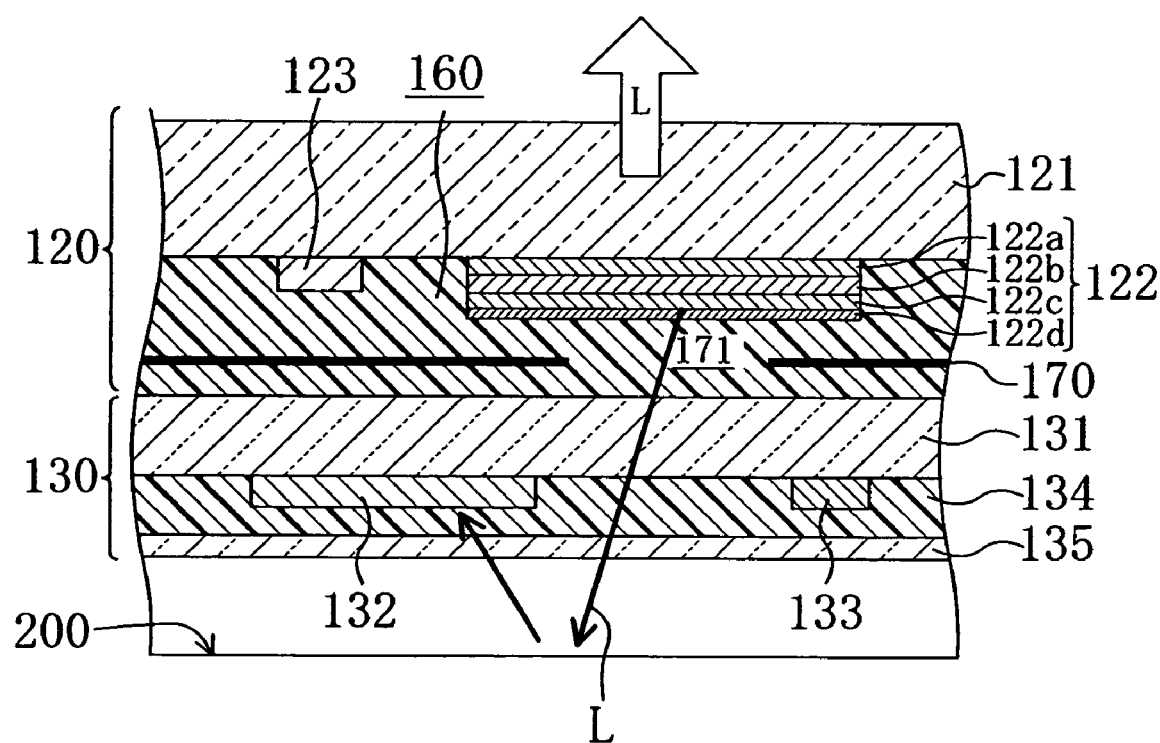
FIG. 8 is a cross-sectional view illustrating a part of an image input/output device according to Embodiment 5 of the present invention.
Figure 9:
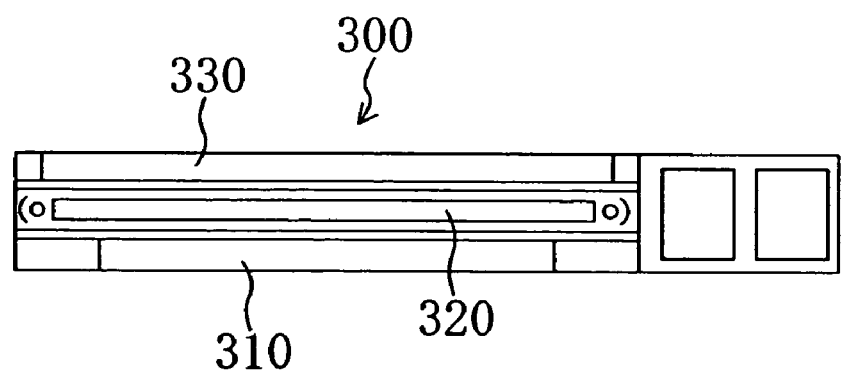
FIG. 9 is a side cross-sectional view illustrating a conventional image input/output device.

FIG. 8 is a cross-sectional view illustrating a part of the image input/output device 100 according to Embodiment 5 of the present invention. The same components as those of Embodiment 1 will be denoted by the same reference numerals.

In the image input/output device 100, the organic EL display substrate 121 is placed so that the element-side surface thereof is facing inwardly, while the image sensor substrate 131 is placed so that the element-side surface thereof is facing outwardly. The resin layer (the transparent filler) 160 made of an adhesive resin is formed between the organic EL display substrate 121 and the image sensor substrate 131, thereby preventing the organic EL elements 122 from contacting the air or moisture. Moreover, the protection substrate 135 is provided so as to oppose the image sensor substrate 131 via the resin layer 134 therebetween, thereby forming the image sensor 130.

Other than this, the image input/output operation and the functions/effects of the image input/output device 100 of the present embodiment are the same as those of Embodiment 3.

Alternative Embodiments

While the organic EL display substrate 121 and the image sensor substrate 131 are provided as separate substrates in Embodiments 1 to 5 described above, the present invention is not limited to this. Alternatively, the organic EL elements 122 and the photodetector elements 132 may be formed on the same substrate. Note however that when an organic EL element and a photodetector element are provided in the same pixel on the same substrate, problems may arise. For example, the aperture ratio (the ratio of the area that is used effectively with respect to the total area of the pixel) of each of the elements may decrease, and the element structure and the process may become complicated, thereby making the production difficult. In the structures of Embodiment 1 to 5 described above, the organic EL elements 122 and the photodetector elements 132 are formed on separate substrates, thereby providing an advantage that these elements can be designed independently and optimally without sacrificing their aperture ratios.

Moreover, while light is emitted from the organic EL display 120 in a line sequential manner for detecting image information in Embodiment 1 to 5 described above, the present invention is not limited to this. Alternatively, the organic EL display 120 may emit light from the entire surface thereof at the same time.

Moreover, in Embodiment 1 to 5 described above, the image information reading operation is initiated for those the photodetector elements 132 that have already detected and stored image information, before light emission from all portions of the organic EL display 120 for detecting image information is completed. However, the present invention is not limited to this. Alternatively, the operation of reading image information from the photodetector elements 132 may be initiated after light emission from all portions of the organic EL display 120 is completed.

Moreover, in Embodiment 1 to 5 described above, the operation of reading image information from the photodetector elements 132 of one row is initiated immediately after the completion of light emission from the same row of the organic EL display 120 in a line sequential manner for detecting image information. Specifically, a scanning voltage is supplied to the scanning line of the $n^{th}$ row of the image sensor 130 when a scanning voltage is supplied to the scanning line of the $n+1^{th}$ row of the organic EL display 120. However, the present invention is not limited to this. For example, a scanning voltage may be supplied to the scanning line of the $n^{th}$ row of the image sensor 130 when a scanning voltage is supplied to the scanning line of the $n+4^{th}$ row of the organic EL display 120, thereby setting a longer interval between when image information is obtained and when the image information is read.

Moreover, while the image sensor 130 and the organic EL display 120 have the same resolution (i.e., the components thereof are in one-to-one correspondence with each other) in Embodiment 1 to 5 described above, the present invention is not limited thereto. Alternatively, the resolution of the image sensor 130 may be different from (e.g., twice as much as) that of the organic EL display 120.

Moreover, in Embodiment 1 to 5 described above, an image is displayed on the organic EL display 120 based on image information obtained from the image sensor 130. The manner in which the obtained image is displayed is not limited to any particular manner as long as an image is displayed on the organic EL display 120 based on image information obtained from the image sensor 130. For example, the obtained image may be displayed as it is or on an enlarged scale, or a translation of obtained text data may be displayed.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention that fall within the true spirit and scope of the invention.

The invention claimed is:

1. An image input/output device comprising:
    an image information detection section for receiving reflected light from an image information object to detect the image information of the object, and a self-luminous image display section for displaying an image based on the image information detected by the image information detection section are attached together in a back-to-back arrangement,
    wherein the self-luminous image display section functions as an image-information-detecting light source for irradiating an image information object with light through the image information detection section,
    wherein the image display section, which functions as the image-information-detecting light source, emits light only toward an image display side; and
    wherein the image input/output device further comprises light reflecting means, different than the information object, for reflecting light emitted toward the image display side from the image display section, which functions as the image-information-detecting light source, toward an image information detection side.

2. The image input/output device of claim 1, wherein the light reflecting means is a mirror provided on one side, closer to the image display section, of a cover member that can be opened and closed so that the cover member can cover a display surface of the image display section.

3. The image input/output device of claim 1, wherein:
    the image information detection section includes a detection section substrate and a plurality of photodetector elements provided on the detection section substrate; and
    the detection section substrate is placed so that one surface thereof on which the plurality of photodetector elements are provided is facing inwardly.

4. The image input/output device of claim 3, wherein:
    the image display section includes a display section substrate; and
    a transparent filler layer is provided between the detection section substrate and the display section substrate.

5. The image input/output device of claim 1, wherein:
    the image display section includes a display section substrate and a plurality of display elements provided on the display section substrate; and
    the display section substrate is placed so that one surface thereof on which the plurality of display elements are provided is facing inwardly.

6. The image input/output device of claim 5, wherein:
    the image information detection section includes a detection section substrate; and
    a transparent filler layer is provided between the detection section substrate and the display section substrate.

7. The image input/output device of claim 1, wherein:
    the image information detection section includes a detection section substrate and a plurality of photodetector elements provided on the detection section substrate, and the image display section includes a display section substrate and a plurality of display elements provided on the display section substrate; and
    the detection section substrate is placed so that one surface thereof on which the plurality of photodetector elements are provided is facing inwardly, and the display section substrate is placed so that one surface thereof on which the plurality of display elements are provided is facing inwardly.

8. The image input/output device of claim 7, wherein a transparent filler layer is provided between the detection section substrate and the display section substrate.

9. The image input/output device of claim 1, wherein when detecting image information, portions of the image display section, which functions as the image-information-detecting light source, emit light successively, and a portion of the image information detection section, which corresponds to a portion of the image display section that has emitted light, detects and stores image information.

10. The image input/output device of claim 9, wherein an image information reading operation is initiated for those portions of the image information detection section that have already detected and stored image information, before light emission from all portions of the image display section is completed.

11. The image input/output device of claim 9, wherein the image display section successively emits light in a line sequential manner.

12. The image input/output device of claim 11, wherein an image information reading operation is initiated for those portions of the image information detection section that have already detected and stored image information, before light emission from all portions of the image display section in a line sequential manner is completed.

13. The image input/output device of claim 12, wherein image information is read from the image information detection section in a sequential line-addressing corresponding to that of the image display section.

14. The image input/output device of claim 1, wherein a display mode of the self-luminous image display section is an organic electroluminescence display mode or an inorganic electroluminescence display mode.

* * * * *